(12) United States Patent
Akikuni et al.

(10) Patent No.: US 6,297,651 B1
(45) Date of Patent: Oct. 2, 2001

(54) ELECTRO-OPTIC SAMPLING PROBE HAVING UNIT FOR ADJUSTING QUANTITY OF LIGHT INCIDENT ON ELECTRO-OPTIC SAMPLING OPTICAL SYSTEM MODULE

(75) Inventors: Fumio Akikuni; Katsushi Ohta, both of Tokyo; Tadao Nagatsuma, Sagamihara; Mitsuru Shinagawa, Isehara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/491,337

(22) Filed: Jan. 26, 2000

(30) Foreign Application Priority Data

Jan. 27, 1999 (JP) .................................. 11-019138

(51) Int. Cl.[7] .................................. G01R 31/308
(52) U.S. Cl. .................................. 324/753
(58) Field of Search .................................. 324/753, 765

(56) References Cited

U.S. PATENT DOCUMENTS

| | | |
|---|---|---|
| 4,530,600 | 7/1985 | Lopez . |
| 4,815,848 | 3/1989 | Hadeishi . |
| 5,177,351 | 1/1993 | Lagowski . |
| 5,465,043 * | 11/1995 | Sakai .................................. 324/96 |
| 5,969,517 * | 10/1999 | Rao .................................. 324/96 |

FOREIGN PATENT DOCUMENTS

| | | |
|---|---|---|
| 0 555 854 | 9/1993 | (EP) . |
| 2 079 010 | 1/1982 | (GB) . |
| 2 328 015 | 2/1999 | (GB) . |

* cited by examiner

*Primary Examiner*—Safet Metjahic
*Assistant Examiner*—E. LeRoux
(74) *Attorney, Agent, or Firm*—Darby & Darby

(57) ABSTRACT

Disclosed herein is an electro-optic sampling probe in which the quantity of light incident on the electro-optic sampling system module can be adjusted. The probe includes an electro-optic element that has a reflective face, an optical system for transmitting a laser beam received from an external source and an electro-optic sampling optical system module as well as unit for attenuating the quantity of light of the laser beam that is received by the optical system.

3 Claims, 4 Drawing Sheets

ELECTRO-OPTIC SAMPLING PROBE HAVING UNIT FOR ADJUSTING QUANTITY OF LIGHT INCIDENT ON ELECTRO-OPTIC SAMPLING OPTICAL SYSTEM MODULE

BACKGROUND OF THE INVENTION

1. Field of the Invention

The present invention relates to an electro-optic sampling probe (or prober) in which an electric field generated due to a target signal to be measured is applied to an electro-optic crystal, and an optical pulse signal generated based on a timing signal is incident onto the electro-optic crystal, and the waveform of the target signal is observed according to the polarization state of the incident optical pulse signal. In particular, the present invention relates to an electro-optic sampling probe whose optical system is revised and improved.

This application is based on Patent Application No. Hei 11-19138 filed in Japan, the contents of which are incorporated herein by reference.

2. Description of the Related Art

In a conventional technique, the waveform of a target signal (to be measured) can be observed by applying an electric field generated due to the target signal to an electro-optic crystal, inputting a laser beam to the electro-optic crystal, and observing the waveform of the target signal according to the polarization state of the laser beam. If a laser beam transformed into a pulse form is used for sampling the target signal, the measurement can be performed with a very high temporal resolution. The electro-optic sampling probe (abbreviated to "EOS probe", hereinbelow) employs an electro-optic probe having the above function.

In comparison with the conventional probes employing known electric probes, the above EOS probe has the following characteristics and thus has received widespread notice:

(1) A ground line is unnecessary for measuring the signal.
(2) The tip of the electro-optic probe is insulated from the circuit; thus, a high input impedance can be obtained and (the state of) the point to be measured is not significantly disturbed.
(3) An optical pulse signal is used; thus, wide-band measurement of a GHz order can be performed.
(4) An electro-optic crystal can be made to contact a wafer of an IC (or the like), and a laser beam is converged on the wiring printed on the IC wafer, thereby enabling the measurement of thin wiring which a metallic pin cannot physically contact.

The structure of a conventional EOS probe will be explained with reference to FIG. 3. In FIG. 3, reference numeral 1 indicates an IC wafer connected to an external device via a power supply line and a signal line. Reference numeral 2 indicates an electro-optic element using an electro-optic crysal. Reference numeral 31 indicates an objective used for converging the beam incident on the electro-optic element 2. Reference numeral 41 indicates the (main) body of the probe, comprising a dichroic mirror 41a and a half mirror 41b. Reference numeral 6a indicates an EOS optical system module (called "EOS optical system", hereinbelow) comprising a photodiode, a polarized beam splitter, a wave plate, and so on. Reference numeral 69 indicates a fiber collimator attached to one end of the EOS optical system.

Reference numeral 7 indicates a halogen lamp for irradiating IC wafer 1 to be measured. Reference numeral 8 indicates an infrared camera (abbreviated to "IR camera", hereinbelow) for confirming the positioning for converging a beam onto a target wiring provided on the IC wafer 1. Reference numeral 9 indicates a suction stage for fixing the IC wafer 1, which can be finely moved in the x, y, and z directions. Reference numeral 10 indicates a surface plate (only a portion shown here) to which the suction stage 9 is attached. Reference numeral 11 indicates an optical fiber for transmitting a laser beam emitted from an external device.

Below, with reference to FIG. 3, the optical path of the laser beam from an external device will be explained. In the figure, the optical path of the laser beam inside the probe body 41 is indicated by reference symbol A.

The laser beam incident via optical fiber 11 on EOS optical system 6a is collimated by fiber collimator 69, and linearly progresses in the EOS optical system 6a and is input into probe body 41. The input beam further progresses straight inside the probe body 41, and is then deflected by 90 degrees by dichroic mirror 41a and then converged by objective 31 onto the electro-optic element 2 disposed on the wiring on the IC wafer 1. Here, the beam is converged onto the face (of the electro-optic element 2) which faces the IC wafer 1.

The wavelength of the laser beam incident via optical fiber 11 on the EOS optical system is 1550 nm. On the other hand, the dichroic mirror 41a has the characteristic of transmitting 5% (and reflecting 95%) of the beam having a wavelength of 1550 nm. Therefore, 95% of the beam emitted from the laser source is reflected and deflected by 90 degrees.

A dielectric mirror is deposited on the face of the electro-optic element 2, which faces the IC wafer 1. The laser beam reflected by this face is again collimated by objective 31 and returns to the EOS optical system 6a through the same path, and is incident on a photodiode in the EOS optical system 6a. The structure of the EOS optical system 6a will be explained later in detail.

Hereinbelow, the operation of positioning the IC wafer 1 by using the halogen lamp 7 and IR camera 8 will be explained. Here, the optical path of the beam emitted from the halogen lamp 7 and the positioning operation will be explained. In FIG. 3, the optical path of the beam emitted from the halogen lamp 7 is indicated by reference symbol B.

The halogen lamp 7 used here emits a light beam having a wavelength range from 400 nm to 1650 nm. The light beam emitted from the halogen lamp 7 is deflected by 90 degrees by half mirror 41b and progresses straight through the dichroic mirror 41a, so that the IC wafer 1 is irradiated by the light beam. In the half mirror 41b used here, the light intensities of the reflected and transmitted beams are the same.

The image of a portion of the IC wafer 1 irradiated by the halogen lamp 7, observed in the field of view of the objective 31, is picked up by the IR camera 8. This IR image is then displayed in monitor 8a. The operator finely moves and adjusts the suction stage 9 while observing the image displayed in monitor 8a, so as to position a target wiring portion (on the IC wafer 1, to be measured) inside the field of view.

The laser beam incident via optical fiber 11 on the EOS optical system 6a is reflected at the face of the electro-optic element 2 positioned on the wiring of IC wafer 1, and is further transmitted through the dichroic mirror 41a. This transmitted beam is confirmed by the operator by observing the image of IR camera 8, and thereby adjusting the suction stage 9 or probe body 41 so as to converge the laser beam at a point on the face of the electro-optic element 2 positioned on the target wiring portion to be measured. Here, the dichroic mirror 41a has a characteristic of transmitting 5% of (the wavelength range of) the laser beam; thus, this laser beam can be confirmed using the IR camera 8.

Below, the operation of measuring a target signal (to be measured) using the EOS probe (shown in FIG. 3) will be explained.

When a voltage is applied to the target wiring on the IC wafer 1, the corresponding electric field is applied to the electro-optic element 2, and the refractive index thereof is then changed due to the Pockels effect. As explained above, the laser beam is incident on the electro-optic element 2, and is reflected by the face which faces the IC wafer 1 and returned through the same optical path. According to the above effect, the polarization state of the beam output from the electro-optic element 2 is changed. This laser beam having a changed polarization state is again incident on the EOS optical system 6a.

In the EOS optical system 6a, the change of the polarization state of this incident laser beam is converted into a change of light intensity, which is detected by a photodiode and further converted into an electric signal. This electric signal is processed by a signal processing section (not shown), thereby measuring the electric signal applied to the target wiring on the IC wafer 1.

The structure of the EOS optical system 6a in FIG. 3 will be explained below.

FIG. 4 is a diagram showing the structure of the EOS optical system 6a in detail.

In FIG. 4, reference numerals 61 and 64 indicate half-wave plates, and reference numeral 62 indicates a quarter-wave plate. Reference numerals 63 and 66 indicate polarized beam splitters, and reference numeral 65 indicates a Faraday element. The optical system consisting of the half-wave plates 61 and 64, quarter-wave plate 62, polarized beam splitters 63 and 66, and Faraday element 65 is called the optical isolator 60. Reference numerals 67 and 68 indicate photodiodes which respectively receive light portions converged by converging lenses (i.e., condensers) 68a and 67a.

The half-wave plate 61 and quarter-wave plate 62 are provided for adjusting the balance between the light portions input into the photodiodes 67 and 68.

Next, the operation of measuring the electric signal of the target wiring on the IC wafer 1, by using the EOS optical system 6a, will be explained.

A laser beam is supplied from an external light source via optical fiber 11 to the EOS optical system 6a. This laser beam is collimated by fiber collimator 69.

This collimated beam is deflected by 90 degrees by the dichroic mirror 41a in the probe body 41, and then converged by the objective 31. The converged laser beam is transmitted through the electro-optic element 2 towards the target face (which faces the wiring of the IC wafer 1) of the electro-optic element 2.

In the above process, an electric field generated by the voltage applied to the wiring is applied to the electro-optic element 2, so that in the electro-optic element 2, the refractive index is changed due to the Pockels effect. Accordingly, when the laser beam incident on the electro-optic element 2 is transmitted through the electro-optic element 2, the polarization state of the beam is changed. This laser beam having the changed polarization state is then reflected by the mirror face of the electro-optic element 2 on the wiring of the IC wafer 1, and returned via the same optical path as that of the inputting process and incident on the EOS optical system 6a. Some portions of this laser beam are isolated by isolator 60, and they are converged by converging lenses 67a and 68a and are incident on photodiodes 67 and 68, and then converted into electric signals.

The change of the polarization state, due to the electro-optic element 2 according to the variation of the voltage of the target portion to be measured (i.e., the target wiring on the IC wafer 1), corresponds to the difference between the outputs from the photodiodes 67 and 68. The electric signal transmitted through the wiring on the IC wafer 1 can be measured by detecting this output difference.

In the above operation, the laser beam output from the fiber collimator 69 originally emits from an external light source (not shown) such as a laser diode, and this laser beam passes through the optical fiber 11, and is collimated by the fiber collimator 69 and is used for measuring the electric signals. Therefore, preferably, the state of the laser beam incident on the photodiodes 67 and 68 is stably fixed.

However, such a laser diode emitting a laser beam is affected by the variation of the environmental temperature, and accordingly, the quantity of light (or light intensity) is varied. Such variation of the quantity of light directly leads to a measurement error, thereby causing an incorrect measurement.

SUMMARY OF THE INVENTION

In consideration of the above circumstances, an object of the present invention is to provide an EOS probe in which the quantity of light incident on the EOS optical system can be adjusted so as to easily perform calibration, thereby always performing a correct measurement.

Therefore, the present invention provides an electro-optic sampling probe comprising:

an electro-optic element, in contact with a target wiring provided on the front face of an IC wafer to be measured, wherein an electric field is applied via the wiring to the electro-optic element so that the optical characteristics of the electro-optic element are changed;

an electro-optic sampling optical system module, including a polarized beam splitter, a wave plate, and a photodiode, for:

isolating a portion of a laser beam which is emitted from an external source, transmitted through the electro-optic element, and reflected by a face of the electro-optic element, said face facing the wiring, and converting the isolated portion into an electric signal; and wherein the electro-optic sampling optical system module further comprises:

a unit for adjusting the quantity of light of the laser beam, which is emitted from the external source and is input into the electro-optic sampling optical system module, said unit being provided at the external source side with respect to the position of the electro-optic sampling optical system module.

According to the above structure, the quantity of light of the laser beam incident on the photodiode can always be fixed. Therefore, even if the quantity of light at the laser source side (such as a laser diode) is changed, the measurement error can be very low and it is possible to perform a stable measurement.

The unit for adjusting the quantity of light of the laser beam may comprise a half-wave plate and a polarized beam splitter. Accordingly, the adjustment of the quantity of light is possible using a simple arrangement.

Preferably, in the unit for adjusting the quantity of light of the laser beam, the half-wave plate is fixed to a wave-plate rotating section for freely rotating the half-wave plate around the optical axis of the incident laser beam. Therefore, if an initial state is set such that the quantity of light (i.e., laser beam) transmitted through the polarized beam splitter is half the quantity of light incident on the half-wave plate, then the quantity of light of the laser beam input into the electro-optic sampling optical system module can be increased or decreased by increasing or decreasing the rotational angle of the half-wave plate.

DESCRIPTION OF THE PREFERRED EMBODIMENTS

Hereinafter, an embodiment of the EOS (electro-optic sampling) probe according to the present invention will be explained in detail with reference to the drawings.

Figure 1:
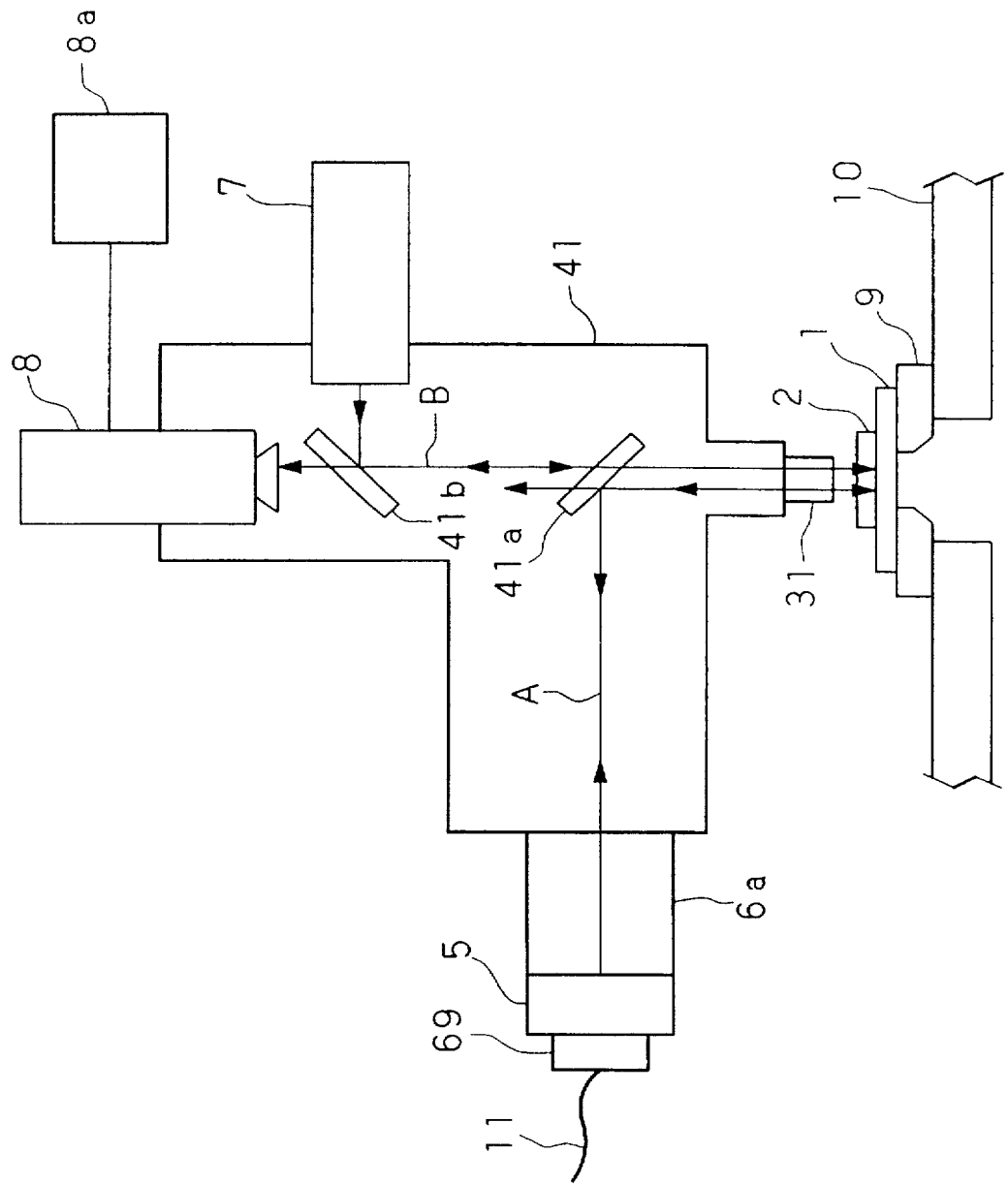
FIG. 1 is a diagram showing the structure of the electro-optic sampling (EOS) probe as an embodiment according to the present invention.
Figure 3:
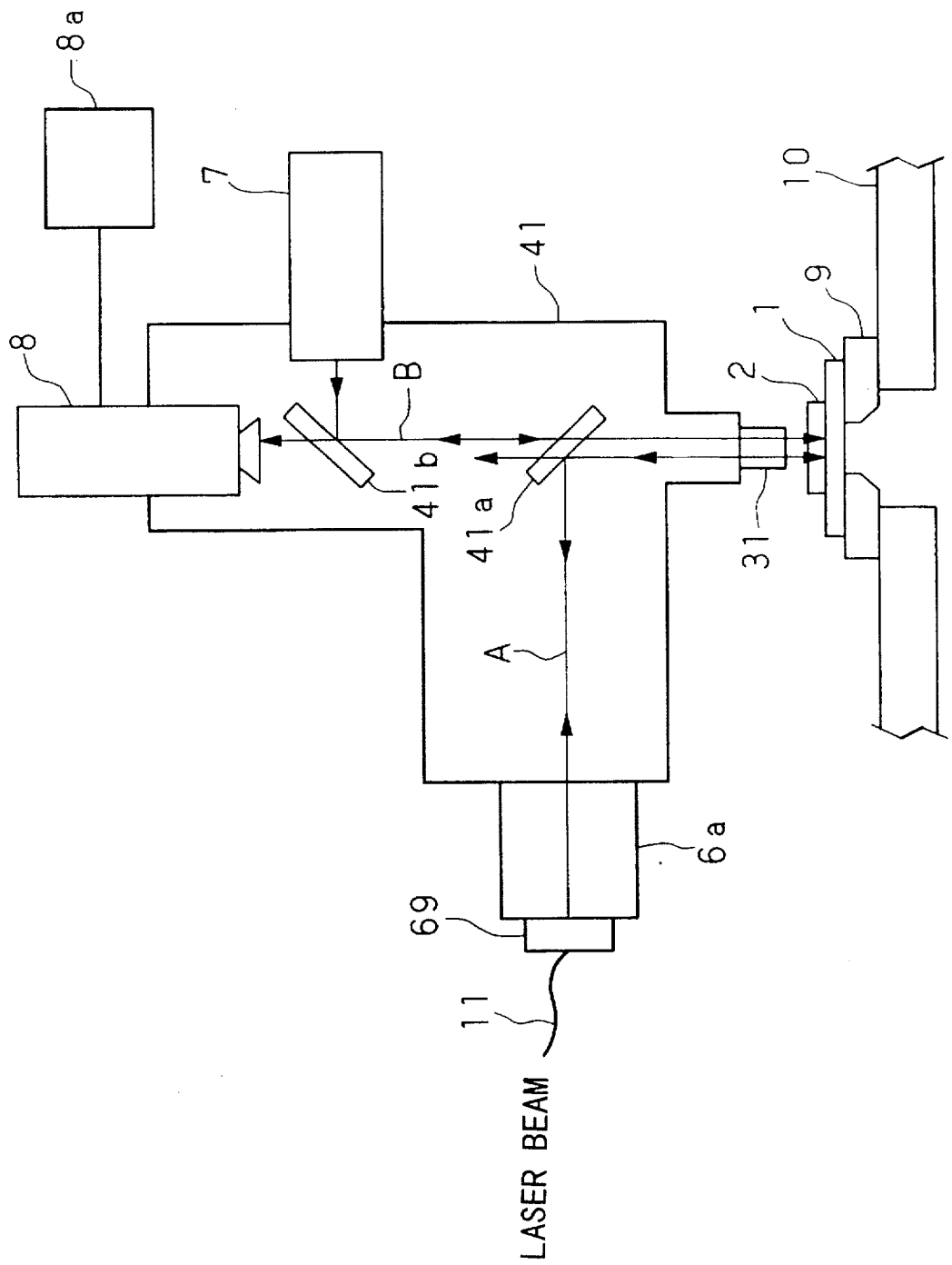
FIG. 3 is a diagram showing the structure of a conventional electro-optic sampling probe.

FIG. 1 is a diagram showing the structure of the present embodiment. In FIG. 1, the parts identical to those in FIG. 3 (which shows a conventional probe) are given identical reference numerals, and explanations thereof are omitted. The difference between the probe shown in FIG. 1 and the conventional structure is to provide a unit 5 for adjusting the quantity of incident light between the optical isolator 60 of the EOS optical system 6a and the fiber collimator 69, as shown in FIG. 1.

Figure 2:
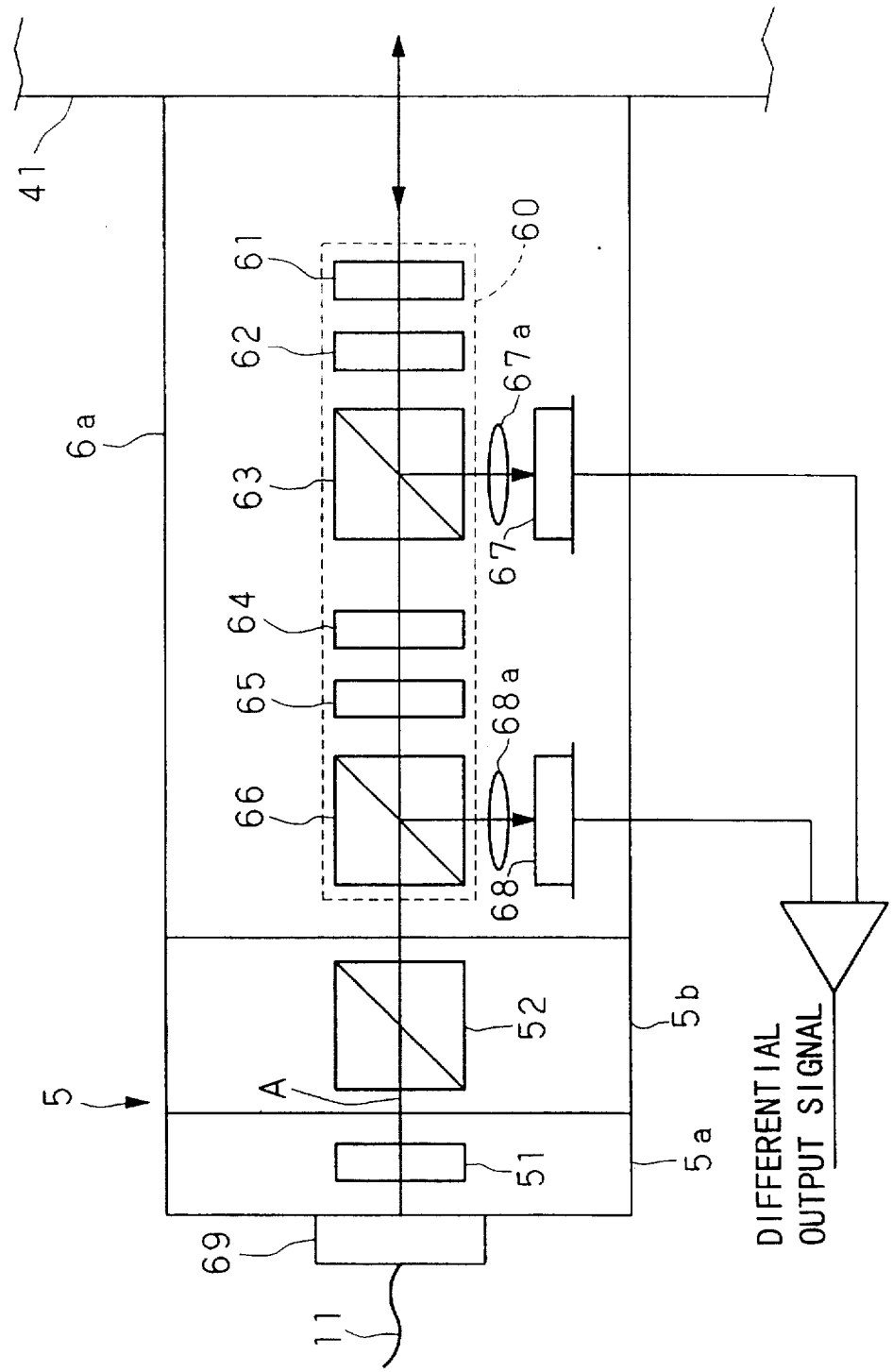
FIG. 2 is a diagram showing the structure of the EOS optical system 6a shown in FIG. 1.

FIG. 2 is a diagram showing the structure of the EOS optical system 6a in detail.

Figure 4:
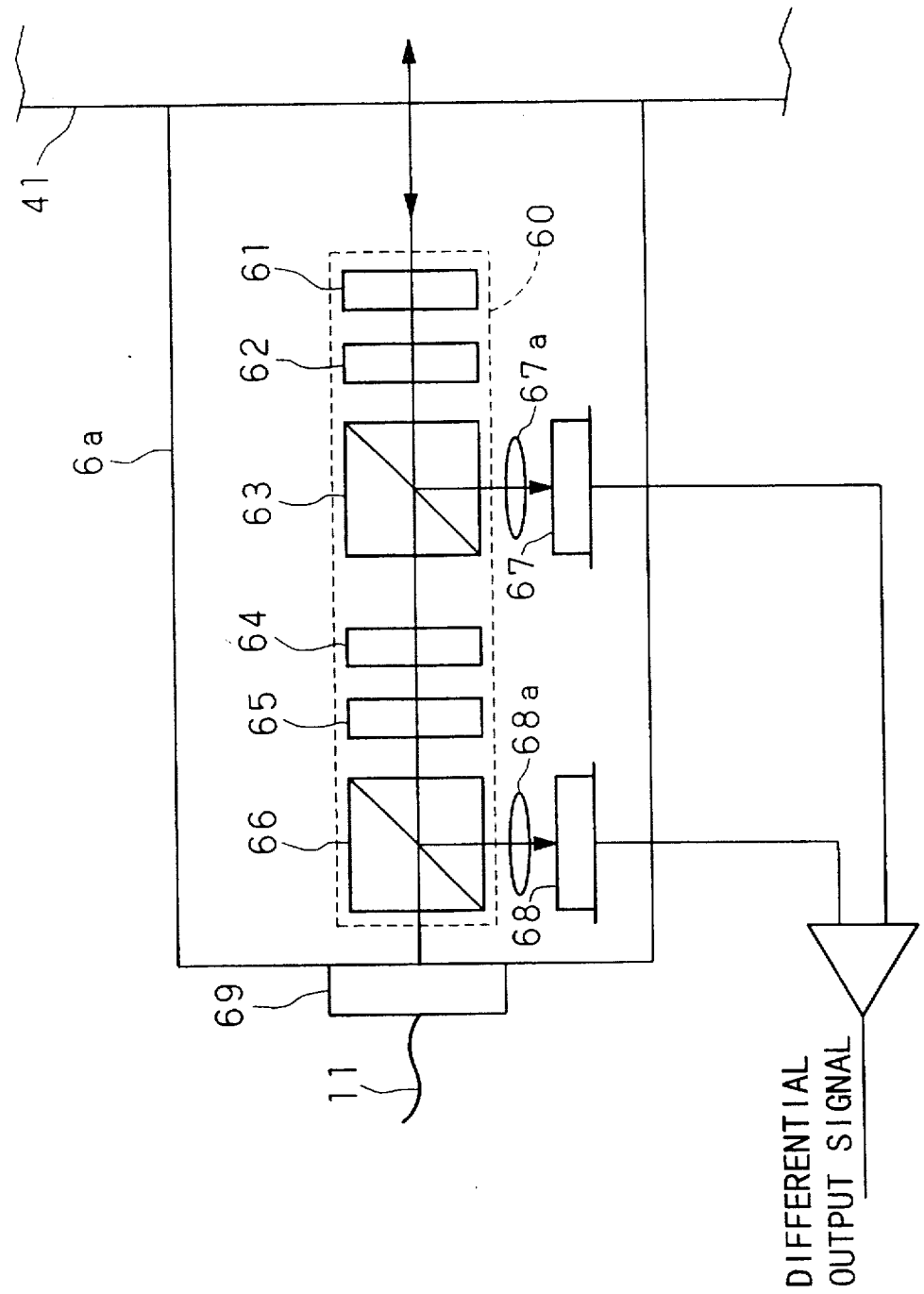
FIG. 4 is a diagram showing the structure of the EOS optical system 6a shown in FIG. 3.

In FIG. 2, the parts identical to those in FIG. 4 showing the conventional EOS optical system are given identical reference numerals, and explanations thereof are omitted. In FIG. 2, reference numeral 51 indicates a half-wave plate, and reference numeral 52 indicates a polarized beam splitter. Reference numeral 5a indicates a wave-plate rotating section for rotating the half-wave plate 51 around the optical axis A, and reference numeral 5b indicates a polarizing filter holding section for holding the polarized beam splitter 52.

The polarized beam splitter 52 employed in the unit 5 for adjusting the quantity of incident light may be substituted with a polarizing filter.

The optical fiber 11 is a polarization maintaining optical fiber, and a linearly polarized light beam emitted from a light source such as a laser diode is incident on the optical fiber 11 in consideration of the optical axis of the fiber suitable for the linear polarization.

The principle of adjusting the quantity of the incident laser light in the unit 5 (for adjusting the quantity of incident light) will be explained below.

First, the half-wave plate 51 is placed in a manner such that the polarization state of light which is transmitted through the half-wave plate is not changed. Accordingly, all of the linearly polarized light beam output from the fiber collimator 69 is transmitted through the polarized beam splitter 52.

When the half-wave plate is rotated around the optical axis by 22.5°, the linearly polarized light beam incident on the half-wave plate is rotated by 45°. Accordingly, the polarized beam splitter 52 divides the input beam into (i) polarized light beam P which goes straight and is transmitted through the polarized beam splitter, and (ii) polarized light beam S which is reflected towards the direction perpendicular to the incident optical axis. As a result, the quantity of light transmitted through the polarized beam splitter 52 is half the quantity of the incident light.

By further rotating the half-wave plate 51, the quantity of light transmitted through the polarized beam splitter 52 can be much more decreased.

Therefore, with the initial state in which the half-wave plate 51 is rotated by 22.5°, the angle of further rotation with respect to the initial state can be adjusted, that is, can be increased or decreased, thereby increasing or decreasing the quantity of light transmitted through the polarized beam splitter 52. The unit 5 for adjusting the quantity of incident light uses this principle so as to adjust the quantity of light incident on the EOS optical system 6a.

With reference to FIGS. 1 and 2, the operation of calibrating the EOS optical system 6a by using the unit 5 for adjusting the quantity of incident light will be explained below.

First, the values of current output from the photodiodes 67 and 68 are measured using an ammeter or the like. Here, predetermined current value(s) for calibration are specified in advance, and the half-wave plate 51 is rotated so as to increase or decrease the quantity of light of the laser beam output from the fiber collimator 69, and to obtain the predetermined current value(s) for calibration.

Such a calibrating operation is executed every time the measurement using this EOS probe (shown in FIG. 1) is performed, thereby maintaining a fixed quantity of light input into the photodiodes 67 and 68, and thus executing a correct measurement.

The unit 5 for adjusting the quantity of incident light is provided between the fiber collimator 69, the entrance for the laser beam into the EOS probe, and the optical isolator 60, and the calibration is performed using the output values of the photodiodes 67 and 68 functioning as the exit of the laser beam. Therefore, the calibration relates to all the optical components between the entrance and exit of the laser beam. Accordingly, it is possible to calibrate, for example, the decrease of the quantity of light incident on photodiodes caused by a decrease of the transmittance or reflectance due to deterioration over time or degradation of an optical component, or to a shift of the optical axis.

In addition, the polarized beam splitter 52 may be omitted, and the isolation of a portion of light whose polarization plane has been changed may be performed by the polarized beam splitter 66.

What is claimed is:

1. An electro-optic sampling probe comprising:

an electro-optic element having a reflective face to physically contact wiring on an IC wafer to measure a voltage, the refractive index of the electro-optic element being changed according to the variation of an electric field generated by the variation of the voltage being measured;

an optical system for transmitting a laser beam received from an external source to the electro-optic element and to be outputted from a reflective surface of the electro-optic element;

an electro-optic sampling optical system module, including;

a first optical system having a polarized beam splitter, and a wave plate for isolating a first portion of the laser beam outputted from the electro-optic element and outputting the remaining portion, and a first photodiode for receiving and converting said first isolated portion into an electric signal;

a second optical system having a polarized beam splitter and a wave plate for isolating said remaining portion of the laser beam outputted from said first optical system, and a second photodiode for receiving and converting said remaining isolated portion into an electric signal, wherein the difference between the electric signal outputs from the first and second photodiodes corresponds to a change of the refractive index of said electro-optic element; and a unit for attenuating the quantity of light of the laser beam from the external source that is received by said optical system, said unit comprising a device for rotating the polarization direction of the light from the external source and a polarizing device, and said unit being between the external source and the electro-optic sampling optical system module.

2. An electro-optic sampling probe as claimed in claim 1, wherein the device for rotating the polarization direction of the light comprises a half-wave plate and the polarization device is one of a polarized beam splitter and a polarization filter.

3. An electro-optic sampling probe as claimed in claim 2, wherein the half-wave plate is fixed to a wave-plate rotating section for freely rotating the half-wave plate around the optical axis of the incident laser beam.

* * * * *